United States Patent [19]

Akahoshi et al.

[11] Patent Number: 4,865,888
[45] Date of Patent: Sep. 12, 1989

[54] PROCESS FOR ELECTROLESS COPPER PLATING AND APPARATUS USED THEREFOR

[75] Inventors: Haruo Akahoshi, Hitachi; Kanji Murakami, Mito; Mineo Kawamoto, Hitachi; Akio Takokoro, Ibaraki; Ritsuji Toba, Hadano; Toyofusa Yoshimura, Ibaraki, all of Japan

[73] Assignee: Hitachi, Ltd., Tokyo, Japan

[21] Appl. No.: 206,041

[22] Filed: Jun. 13, 1988

[30] Foreign Application Priority Data

Jun. 16, 1987 [JP] Japan ............... 62-147868

[51] Int. Cl.$^4$ ............................................. B05D 1/18
[52] U.S. Cl. ............................ 427/443.1; 118/410; 118/429; 118/600
[58] Field of Search ............... 427/443.1; 118/410, 118/429, 600

[56] References Cited

U.S. PATENT DOCUMENTS

| | | | |
|---|---|---|---|
| 2,938,805 | 5/1960 | Agens | 106/1.26 |
| 4,152,467 | 5/1979 | Alpaugh | 427/443.1 |
| 4,158,076 | 6/1979 | Wallsten | 118/410 |

Primary Examiner—Shrive Beck
Assistant Examiner—Vi Duong Dang
Attorney, Agent, or Firm—Antonelli, Terry & Wands

[57] ABSTRACT

An electroless copper plating process for producing fine patterned wiring boards is improved by supplying very fine oxygen-containing gas bubbles through a porous alkali-resistant resin gas dispersing tube. An electroless copper plating apparatus having such a gas dispersing tube is also provided.

21 Claims, 3 Drawing Sheets

PORE DIAMETER OF
GAS DISPERSING PIPE (mm)

PROCESS FOR ELECTROLESS COPPER PLATING AND APPARATUS USED THEREFOR

BACKGROUND OF THE INVENTION

This invention relates to a process for electroless copper plating and an apparatus used therefor. More particularly, this invention relates to a process for electroless copper plating suitable for producing printed wiring boards having fine circuits by an additive method, and an apparatus used therefor.

It has been known in carrying out electroless copper plating to introduce an oxygen-containing gas such as air into a plating solution in order to stabilize the plating solution. That is, in the electroless plating solution, there is a tendency to lower a dissolved oxygen concentration by the generation of hydrogen gas during the plating reaction, and also the dissolved oxygen seems to be consumed by an oxidation reaction of Cu(I) which seems to be a by-product as follows:

$$Cu_2O + \tfrac{1}{2} O_2 \longrightarrow 2CuO \tag{1}$$

$$2CuO + 2L^{4-} + 2H_2O \longrightarrow 2Cu-L^{2-} + 4OH^- \tag{2}$$

L = a complexing agent

In order to compensate the lowering in the dissolved oxygen concentration and to maintain stability of the plating solution, there have been proposed various methods for introducing an oxygen-containing gas into a plating solution and dissolving the oxygen in the plating solution (e.g. U.S. Pat. Nos. 4,152,467 and 4,632,852). But according to these U.S. patents, it is only described that air or oxygen is injected into the bath via conduits (U.S. Patent No. 4,152,467) and that an oxygen-containing gas is injected into the electroless copper plating solution (U.S. Pat. No. 4,632,852), and there is no description nor suggestion how to inject the oxygen-containing gas concretely. There was no problem so long as printed wiring boards have wiring pattern in larger size. But with recent requirements for higher density of printed wiring boards and finer wiring patterns, there arises a problem in that it is impossible to form wiring patterns uniformly and precisely by only injecting air or an oxygen-containing gas into the plating solution.

On the other hand, Japanese Patent Unexamined Publication No. 59-161895 discloses a plating apparatus wherein a gas dispersing pipe having a large number of small holes is installed at the bottom of a tank so as to supply oxygen-containing bubbles through the gas dispersing pipe. In this case, the diameter of the small holes is about 0.4 mm at least. Thus the diameter of the bubbles come out from these small holes becomes about 2 mm at least. The deeper the depth of the plating solution becomes, the larger the diameter of the bubbles at the plating solution surface becomes, although the diameter of bubbles may be small at the bottom of the tank. For example, when the depth of the plating solution is 1 to 2 meters, diameter of bubbles at the plating solution surface becomes several centimeters or more. When electroless plating of printed wiring boards, particularly those having fine wiring patterns is conducted under such circumstances, there arise problems in that the plating reaction is stopped at independent fine land portions, there takes place abnormal deposition on portions other than wiring patterns in the higher portions of plating wiring density, and the like. Further, there is also a problem in that copper is easily deposited on portions not directly contacted with bubbles from the gas dispersing pipe such as portions in the tank below the gas dispersing pipe, the bottom portion, hollow portions on the side walls of the tank, and the like. In addition, when the amount of oxygen-containing gas introduced is increased using a plating tank having the structure as mentioned above, since the diameter of bubbles is large, there arise problems in that the plating solution is vigorously agitated and a substrate to be plated is deformed by the bubbles, which results in causing contact with instruments and neighboring substrates and non-deposition or abnormal deposition on portions other than the pattern portions.

SUMMARY OF THE INVENTION

It is an object of this invention to provide a process for electroless copper plating suitable for producing wiring boards, particularly having very fine circuit patterns, and an apparatus used therefor, overcoming the problems as mentioned above.

This invention provides a process for conducting electroless copper plating in an electroless copper plating solution comprising a copper salt, a complexing agent for the copper salt, a reducing agent for the copper salt, and a pH adjusting agent, which comprises supplying an oxygen-containing gas having a bubble diameter of about twice or less of the maximum size of a land in the longer direction of a fine pattern-sized printed circuit board to be plated into the electroless copper plating solution, and conducting electroless copper plating.

This invention also provides an apparatus for electroless copper plating using an electroless copper plating solution comprising a copper salt, a complexing agent for the copper salt, a reducing agent for the copper salt, and a pH adjusting agent, characterized in that said apparatus has a means for dispersing an oxygen-containing gas having a bubble diameter of about twice or less of the maximum size of a land in the longer direction of a fine pattern-sized printed circuit board to be plated into the electroless copper plating solution.

DESCRIPTION OF THE PREFERRED EMBODIMENTS

Figure 1:
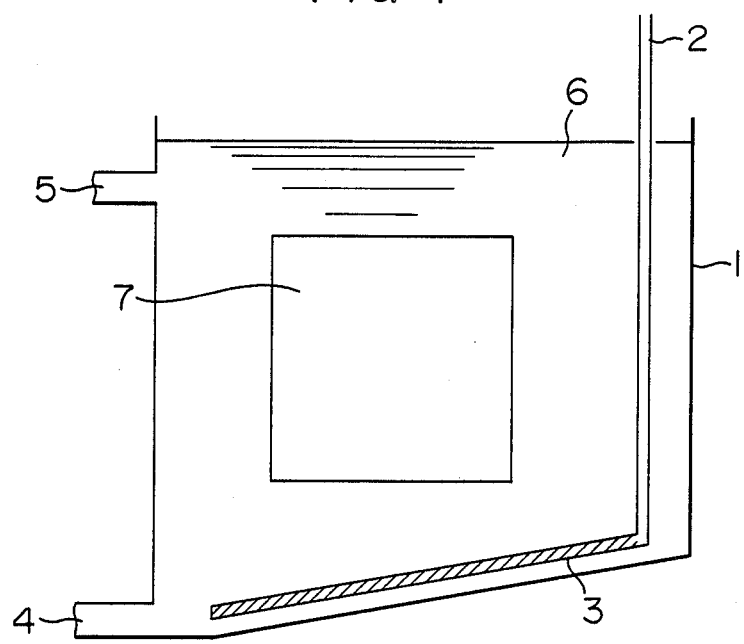
FIG. 1 is a longitudinal cross-sectional view of one example of the apparatus of this invention.
Figure 2:
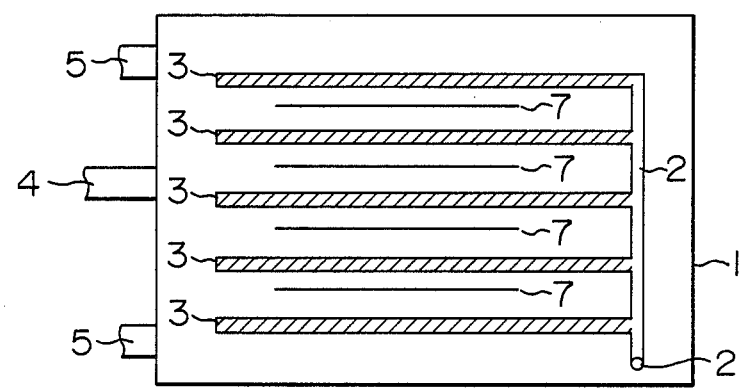
FIG. 2 is a top view of the apparatus of FIG. 1.
Figure 3:
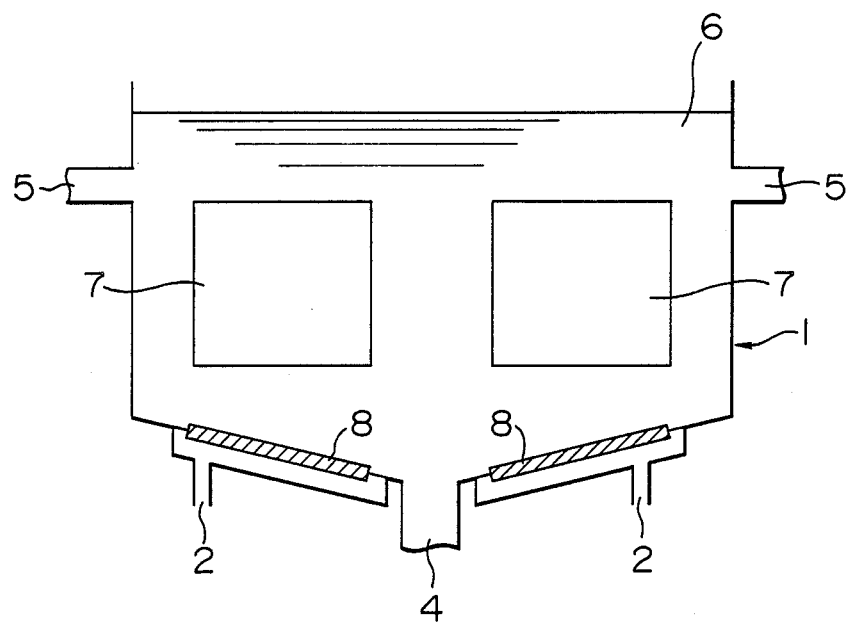
FIG. 3 is a longitudinal cross-sectional view of another example of the apparatus of this invention.
Figure 4:
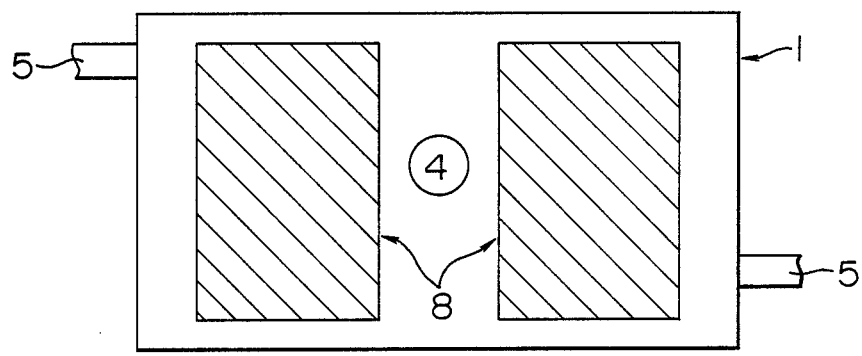
FIG. 4 is a top view of the apparatus of FIG. 3.

It is known that the dissolved oxygen concentration in a plating solution influences plating characteristics of electroless copper plating. In this case, the dissolved oxygen concentration in the plating solution seems to be determined by a kinetic equilibrium between the substitution or consumption of the dissolved oxygen and the replenishment of dissolved oxygen obtained by blowing of an oxygen-containing gas into the plating solution. In contrast to the plating reaction and the formation of Cu(I), which reactions take place locally at the plating surface which is a heterogenous interface in the plating solution, a great lowering in the dissolved oxygen concentration easily takes place by the small amount of substitution or consumption, since the saturated solubility of oxygen in an aqueous solution is low. Thus, the dissolved oxygen concentration in the plating solution is easily changed locally with a large magnitude. More concretely, oxygen is rapidly supplied from bubbles at portions near surfaces of bubbles of oxygen-containing gas, while the oxygen concentration near the plating surface is lowered greatly. Therefore, to maintain the dissolved oxygen concentration in the plating solution uniform, even in local portions, is a very important problem, particularly in the production of high density fine wiring patterns uniformly and precisely.

When the wiring pattern size to be plated is larger than that of non-uniform region, the local non-uniformity as mentioned above is not a serious problem. But when the wiring pattern size becomes relatively smaller than the non-uniform region, it was found by the present inventors that the plating reaction is stopped locally or abnormal deposition takes place locally due to non-uniformity of the local oxygen concentration. The words "pattern size" mean the minimum size of a land in the longer direction. Therefore, the finer the wiring pattern to be produced by electroless copper plating becomes, the higher the uniformity is required. For example, when the diameter of bubbles introduced into the plating solution is about twice or more as large as the size of the land having the minimum size and whole the lands are contacted with the bubbles, a copper oxide film is formed on the land surface due to rapid supply of oxygen from the bubbles through a liquid film of interface. Since copper oxide has no catalytic ability for the oxidation reaction of formaldehyde used as a reducing agent in an ordinary electroless copper plating, the plating reaction is stopped when the whole surface of continuous plating pattern is covered by the copper oxide, which results in causing no auto-catalytic reaction when the bubble is moved and the surface is contacted with the plating solution again.

In order to solve such a problem, the present inventors have found for the first time that it is effective to avoid the covering of the minimum circuit pattern to be plated with one bubble by minimizing the bubble diameter, for example, by making the bubble size of the oxygen-containing gas about twice or less as large as the minimum pattern size to be plated.

The bubble size obtained by the prior art apparatuses was several centimeters or more. Thus, it was difficult to avoid the generation of local plating reaction stoppage in the plating of fine pattern size. Further, when the bubble diameter is large, since a rising rate of bubbles is fast, the bubble density near the gas dispersing pipe is large but decreases with the distance from the gas dispersing pipe, which results in easily lowering the dissolved oxygen concentration and easily causing abnormal deposition. As mentioned above, when the bubble diameter of the introduced oxygen-containing gas is large, there easily take place the plating reaction stoppage and abnormal deposition simultaneously. This tendency becomes remarkable, when the wiring pattern becomes finer and the wiring density becomes higher.

The present inventors have found for the first time that these problems can only be solved by making the bubble size smaller than that obtain by the prior art when the oxygen-containing gas is introduced into the plating solution.

Such a bubble diameter changes depending on fine wiring pattern sizes (the minimum size of a land in the longer direction) to be plated. For example, when the wiring pattern size is 0.5 mm, the bubble diameter is preferably 0.3 to 1.0 mm. When the pattern size is 0.1 mm, the bubble diameter is preferably 0.05 to 0.2 mm. When the pattern size is larger than 2.0 mm, there is no problem even if the bubble diameter is 5 to 10 mm. More generally speaking, the bubble diameter is preferably 1 mm or less, more preferably 0.5 mm or less, and most preferably 0.1 mm or less.

As to the amount of bubbles in the plating solution, when the bubble diameter is 1.0 mm or less, e.g. 0.1 mm or less, for example, it is effective to disperse 1% or more, preferably 5% or more, of bubbles converted into 1 atmospheric pressure based on the volume of plating solution. Too much in the amount of bubbles is not suitable for practical use. In usual, about 10% to 30 or 40% of bubbles are sufficient for practical use. In the case of dispersing bubbles having a bubble diameter of 1.0 mm or less into the plating solution by using an oxygen-containing gas, it is effective to make the oxygen amount in the dispersed gas preferably 0.1 mole or more, more preferably 0.15 to 0.5 mole per $m^3$ of the plating solution. In the case of using a gas containing oxygen in a lower concentration, it is preferable to increase the gas flow amount, while in the case of using a gas containing oxygen in a higher concentration, it is preferable to decrease the gas flow amount. But when the oxygen content in the gas is less than 10% by volume, it is not preferable to use such a gas due to too low equilibrium partial pressure in the plating solution.

In order to minimize bubbles of oxygen-containing gas, it is possible to employ a method of using an ejector, a method of mechanically dividing bubbles with rotating blades, a method of jetting a gas from an outer periphery portion of rotating porous plate, and the like. But in the case of using in an electroless copper plating apparatus, it is preferable to use a porous alkali-resistant resin molded article which has chemical resistance and simple structure and can produce fine bubbles without using moving member. By using such a porous alkali-resistant resin molded article, the disadvantages of the prior art method wherein small holes are drilled in a pipe are completely removed.

As resins for the porous alkali-resistant resin molded article, there can be used fluorine-containing resins, polyethylenes, polypropylenes, polystyrenes, acrylic resins, polyvinyl chloride, poly-4-methylpentene, polysulfones, polyphenylene oxide, and the like.

As the shape of the molded article, there can be used oriented sheets, oriented tubes, or sheets, tubes, or plates obtained by molding powders with heating.

Preferable examples of the porous alkali-resistant resin molded article are a porous gas dispersing pipe made from a fluorine-containing resin such as polytetrafluoroethylene (PTFE), a porous gas dispersing pipe made from polypropylene, and the like.

The pore diameter of porous alkali-resistant resin gas dispersing pipe can be varied from about 100 μm or less in average to about 10 μm or less in average depending on processing. The pore diameter of about 20 μm or less in average is more preferable. The pore size can be measured by a conventional method, e.g. by observing the surface state using an optical microscope or a scanning type electron microscope.

In order to disperse finer bubbles from the porous alkali-resistant resin gas dispersing pipe, it is effective to subject the surface of the gas dispersing pipe contacting with the plating solution to hydrophilic treatment. In the case of using such a hydrophilic treated gas dispersing pipe, best results can be obtained by adding a small amount of a surface active agent to the plating solution.

In order to make the surface of gas dispersing pipe hydrophilic, there can be used a method for dipping the pipe in a tetrahydrofuran solution of naphthalene complex of metallic sodium, a method of subjecting the surface of gas dispersing pipe to a plasma treatment, a discharge treatment such as corona discharge, a sputter etching treatment, a treatment with osmic acid or graft polymerization, and the like.

Since the electroless copper plating solution is usually alkaline and the electroless copper plating is often carried out at 70 to 90° C., it is necessary to make the gas dispersing pipe sufficiently alkali resistant and chemical resistant. From this point of view, the use of a fluorine resin is preferable. Further, in order to disperse such fine bubbles effectively, it is preferable to add a small amount of a surface active agent to the plating solution as mentioned above. Examples of such a surface active agent are nonionic surface active agents such as polyalkylene oxides and their derivatives. The use of a plating solution containing such a surface active agent from the beginning is preferable from this point of view.

The use of a glass jetting pipe obtained by baking sintered body of glass powder into a glass tube for dispersing fine bubbles in the plating solution may be thought of, but there are many disadvantages in that the sintered body of glass powder is easily broken by mechanical impact, the use of such a glass pipe in an industrial-scale plating apparatus is difficult, and such a glass pipe may gradually be dissolved in an electroless copper plating solution with high alkalinity. When impurities are dissolved from the glass and contaminate the plating solution, quality of plated film and plating characteristics such as plating rate, etc. are often lowered. Therefore, the use of such a glass pipe as a gas dispersing means in the electroless copper plating apparatus has many problems.

When the bubbles are sufficiently fine, there is a fear of bringing about insufficient agitating of the plating solution due to less agitating function caused by rising movement of the bubbles. In such a case, it is possible to introduce bubbles having a diameter of 10 mm or more auxiliarily at the same time. In such a case, when the oxygen concentration in the bubbles having such a large bubble diameter is high, there is a fear of causing the plating reaction stoppage locally. Therefore, the oxygen concentration in the large-diameter bubbles is preferably made low, and should be lower than that in the small-diameter bubbles. For example, it is preferable to make the oxygen concentration in the large-diameter bubbles 50 to 100% of that in the small-diameter bubbles, more preferably 70 to 90%. When the oxygen concentration in the large-diameter bubbles is too low, there undesirably takes place local lowering in the dissolved oxygen concentration.

Therefore, in this case, the means for dispersing an oxygen-containing gas comprises at least one means for dispersing an oxygen-containing gas having a bubble diameter of 0.5 mm or less and at least one means for dispersing an oxygen-containing gas having a bubble diameter of 10 mm or more. The bubbles having a diameter of 10 mm or more can be supplied from a porous alkali-resistant resin gas dispersing tube having a pore diameter of 0.5 mm or more, and the bubbles having a diameter of 0.5 mm or less can be supplied from a porous alkali-resistant resin gas dispersing tube having a pore diameter of 100 $\mu$m or less.

The bubble diameter can be measured by a conventional process. For example, a group of bubbles with a scale is photographed from a side wall of a plating tank made of glass or from a glass window formed at a side wall of a plating tank made of non-transparent material, and then are measured the bubble diameter and the distribution thereof.

Figure 5:
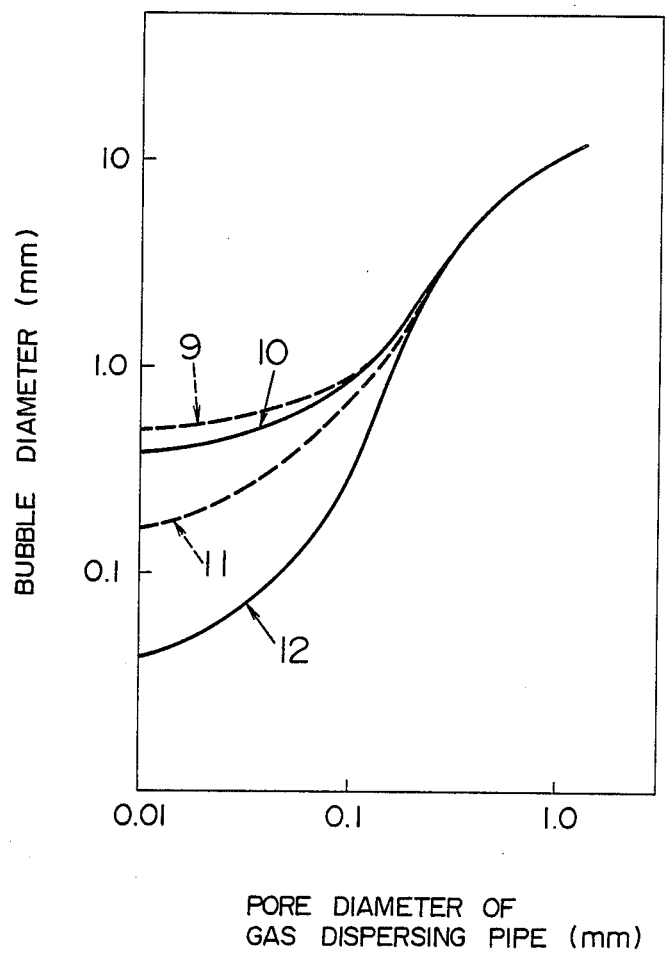
FIG. 5 is a graph showing a relationship between the pore diameter of gas dispersing pipe and the bubble diameter.

One example of the results of such a measurement is shown in FIG. 5, wherein a relationship between the bubble diameter and the pore diameter of gas dispersing pipe is shown. In FIG. 5, the curves 9 and 10 are the results obtained by using a porous gas dispersing pipe made from a fluorine-containing resin not subjected to hydrophilic treatment, and the curves 11 and 12 are those obtained by using a porous gas dispersing pipe made from a fluorine-containing resin subjected to hydrophilic treatment. In the cases of the curves 9 and 11 (dotted lines), a plating solution containing no nonionic surface active agent is used. In the cases of the curves 10 and 12 (full lines), a plating solution containing polyethylene glycol having an average molecular weight of 600 as a nonionic surface active agent is used. The depth of the plating solution is 50 cm. A gas dispersing pipe is placed at the bottom of a plating tank and the bubble diameters are measured at about 30 cm above the gas dispersing pipe. An oxygen-containing gas is introduced into the plating solution at a rate of 50 (/min. The bubble diameter of 0.3 mm or more is obtained by using a gas dispersing pipe made from a fluorine-containing resin having drilled small holes. The bubble diameter of less than 0.3 mm is obtained by using a porous gas dispersing pipe made from a fluorine-containing resin.

By using the graph of FIG. 5, it becomes clear how to obtain the desired bubble diameter by making the pore diameter of a gas dispersing pipe a proper value.

In the present invention, air is usually used as the oxygen-containing gas, and the stability of the electroless copper plating solution can be kept by injection of the air. Pure oxygen can be naturally used as the oxygen-containing gas. Further, a mixture of one or more innert gases such as $N_2$, Ar, He, and the like and $O_2$ can also be used.

In the case of conducting the electroless copper plating by blowing an oxygen-containing gas into the plating solution at a rate of 0.2 $m^3$/min per $m^3$ of the plating solution, the object can also be attained by making the volume of bubbles having a diameter of 0.5 mm or less 50% or more in the whole bubbles blown.

In the present invention, a preferable plating temperature is 40° C. or higher. Below 40° C., no plating film having satisfactorily good mechanical properties can be obtained.

The electroless copper plating solution for use in the present invention comprises a copper salt, a complexing agent for the copper salt, a reducing agent for the copper salt, and a pH-adjusting agent as essential components. Known soluble copper salts such as copper sulfate, cupric chloride, copper acetate, copper formate, etc. can be used as the copper salt. If necessary, copper hydroxide, etc. can be used. It is also possible to provide copper ions by chemical or electrochemical dissolution of metallic copper.

The complexing agent for the copper salt is preferably compounds having a skeleton of >N—C—C—N<, including, for example, ethylenediaminetetracetic acid, N-hydroxyethylethylenediaminetriacetic acid, 1,2-diaminopropanetetracetic acid, diethylenetriaminepentacetic acid, cyclohexanediaminetetracetic acid, etc. When monoamines such as triethanolamine, iminodiacetic acid, iminotriacetic acid, etc. or Rochelle salts are used, there are such problems that plating films having satisfactory mechanical properties may not be obtained or the stability of the electroless copper plating film is not satisfactory and the substantially thick plating film may not be obtained.

A suitable reducing agent for the copper salt is formalin as usually used, and a suitable pH-adjusting agent is sodium hydroxide as usually used.

According to the present invention, the stoppage of plating reaction can be controlled by making the bubble diameter of oxygen-containing gas particularly very fine as mentioned above. Further, by making the bubble diameter very fine, the rise rate of the bubbles becomes late and thus the residence time of bubbles in the plating solution becomes long, which results in distributing the bubbles uniformly in the whole plating tank to control abnormal deposition. In addition, since the specific area of the gas-liquid interface becomes larger, oxygen in bubbles easily dissolves in the plating solution, which results in making the stabilization of the plating solution more effective, even if the same blowing amount of the oxygen-containing gas is used. Particularly when very fine bubbles are dispersed in the plating solution by using a gas having a constant oxygen content such as air, it is possible to locally maintain the oxygen concentration in the plating solution at near the saturated value corresponding to the oxygen partial pressure of the gas blown uniformly. Thus, the stability of the plating solution can be maintained irrespective of plating conditions such as a plating rate, a plating bath load, etc. Further, the plating reaction stoppage and abnormal deposition can effectively be prevented.

This invention is illustrated by way of the following Examples.

EXAMPLE 1

A laminate having adhesive layers with about 30 μm was obtained by coating an adhesive having acrylonitrile-butadiene rubber modified phenol resin as a main component on both sides of a glass cloth reinforced polyimide resin laminate with 0.6 mm thick, and heating at 160° C. for 110 minutes for curing. Then through-holes were drilled at predetermined portions, followed by dipping in a roughening solution containing chromic anhydride and sulfuric acid for roughening the adhesive layer surfaces. The resulting laminate was dipped in an acidic aqueous solution containing a sensitizer (HS 101B, a trade name, mfd. by Hitachi Chemical Co., Ltd.) as a catalyst for chemical plating for 10 minutes, washed with water, treated in an accelerating treating stream containing diluted hydrochloric acid as a main component for 5 minutes, washed with water, and dried at 120° C. for 20 minutes.

On both sides of the substrate thus prepared, dry film photoresists with 35 μm thick (SR-3000, a trade name, mfd. by Hitachi Chemical Co., Ltd.) were laminated. Using test pattern masks having independent lands with the sizes as shown in Table 1, exposure to light and development were conducted to cover portions other than the pattern portions of the substrate surfaces with the resist.

In a plating tank having a volume of 50 liters and equipped with 10 porous gas dispersing pipes made from polytetrafluoroethylene (PTFE) with a diameter of 20 mm (maximum pore daimeter: 70 μm), each surface of said pipes being treated with a tetrahydrofuran solution of naphthalene-sodium complex for making the pipe hydrophilic, at intervals of 5 cm at the bottom of the tank, an electroless copper solution having the composition as shown in Table 1 was filled. Into the plating solution, air was introduced through the gas dispersing pipes at a rate of 50 liters/minute, while heating the plating solution to 70° C.

TABLE 1

| | |
|---|---|
| Copper sulfate · 5 hydrate | 10 g/l |
| Ethylenediamine tetracetic acid | 30 g/l |
| 37% Formaldehyde | 2 ml/l |
| pH | 12.0 |
| 2,2'-Dipyridyl | 30 mg/l |
| Polyethylene glycol (Mw 600) | 20 ml/l |

The bubbles dispersed in the plating solution had a diameter of 100 μm in average. The liquid surface was raised with the beginning of air blowing to increase an apparent volume of the plating solution by about 7% by the dispersion of air bubbles.

To this plating solution, the above-mentioned resist pattern-formed laminate with adhesive layers was dipped so as to make the plating bath load 2 dm²/l. The electroless copper plating was conducted until the plated film became 40 μm thick. After plating, the plated laminate was sufficiently washed with water, and dried to detect plating reaction stoppage portions and abnormal deposition portions. Generation rates of these portions were listed in Table 3.

As is clear from Table 3, in the regions wherein the maximum pattern size is larger than the bubble diameter, no plating reaction stoppage takes place and no abnormal deposition either on the substrate or inner portions of the plating tank is found.

EXAMPLE 2

The process of Example 1 was repeated except for using a glass-epoxy copper-clad laminate of 0.6 mm thick and forming circuits by photoetching the copper foil. Portions other than test pattern portions were masked with the photoresist and the electroless copper plating was conducted in the same manner as described in Example 1 to obtain the plated film of 40 μm thick. The plating reaction stoppage and the abnormal deposition were detected in the same manner as described in Example 1. The results were shown in Table 3.

EXAMPLE 3

In a plating tank having a volume of 50 liters and equipped with 10 porous gas distributing pipes of oriented PTFE tube with a diameter of 20 mm (maximum pore diameter: 10 μm), each surface of said pipes being subjected to hydrophilic treatment in the same manner as described in Example 1 at intervals of 5 cm at the bottom of the tank, a plating solution having the composition as shown in Table 2 was filled. Into the plating solution, air was introduced through the gas dispersing pipes at a rate of 50 l/min, while heating the plating solution to 75° C.

TABLE 2

| Copper sulfate · 5 hydrate | 10 g/l |
| --- | --- |
| Ethylenediamine tetracetic acid | 30 g/l |
| 37% Formaldehyde | 3 ml/l |
| Sodium germanate | 0.5 g/l |
| Uniox MM-1000 (mfd. by Nippon Fats and Oils, Ltd.) | 5 ml/l |

In this plating tank, the same glass cloth reinforced polyimide laminate having adhesive layers thereon masked with the resist at portions other than the pattern portions as used in Example 1 was placed and plated in the same manner as described in Example 1. The plating reaction stoppage and abnormal deposition were detected and shown in Table 3.

Since the average bubble diameter was 40 μm and the residence time of the bubbles in the plating solution was long, fine bubbles were spread to the bottom portion and into the pipes and hallow portions in the tank wall to prevent abnormal deposition on these portions.

EXAMPLE 4

The process of Example 1 was repeated except for using the same plating apparatus as used in Example 3. The plating reaction stoppage and abnormal deposition were detected and shown in Table 3.

COMPARATIVE EXAMPLE 1

In a plating tank having a volume of 500 liters and equipped with 10 polypropylene pipes having a diameter of 20 mm and small holes of 0.5 mm in diameter drilled thereon at intervals of 5 cm, at the bottom of the tank at intervals of 10 cm, the same plating solution as listed in Table 1 was filled and heated to 70° C.

In this plating solution, the same treated substrate as used in Example 1 was dipped so as to make the plating bath load 2 dm²/l. The electroless copper plating was carried out while introducing air into the plating solution through the pipe with drilled small holes at a rate of 100 l/min. The bubble diameter was distributed between 5 mm and 50 mm. With a decrease of the maximum size of each pattern size, the plating reaction stoppage takes place more often as shown in Table 3. Further abnormal deposition was also admitted.

EXAMPLE 5

The process of Example 1 was repeated except for using a porous PTFE molded tube the surface of which was not subjected to the hydrophilic treatment. The bubble diameter was about 0.7 mm. The plating reaction stoppage and abnormal deposition were detected and shown in Table 3.

TABLE 3

| Generation of reaction stoppage (%) | Examples | | | | | Comparative Example 1 |
| --- | --- | --- | --- | --- | --- | --- |
| | 1 | 2 | 3 | 4 | 5 | |
| Pattern size* | | | | | | |
| 60 μm | 0.7 | 0.3 | 0 | 0 | 40 | 46 |
| 100 μm | 0.1 | 0 | 0 | 0 | 12 | 28 |
| 200 μm | 0 | 0 | 0 | 0 | 0.1 | 7 |
| 1 mm | 0 | 0 | 0 | 0 | 0 | 2 |
| Abnormal deposition on substrate | None | None | None | None | None | Yes |
| Deposition of copper on tank bottom | None | None | None | None | None | A little |

Note
*pattern size = size of a land (pattern) in the longer direction.

As mentioned above, since the dissolved oxygen concentration can be maintained uniformly even in local portions in the electroless copper plating tank according to the present invention, electroless copper plating of wiring boards with very fine and high density wiring patterns can be carried out without causing the plating reaction stoppage or abnormal deposition and the like defects.

What is claimed is:

1. A process for conducting electroless copper plating in an electroless copper plating solution comprising a copper salt, a complexing agent for the copper salt, a reducing agent for the copper salt, and a pH adjusting agent, which comprises
supplying an oxygen-containing gas having a bubble diameter of about twice or less of the minimum size of a land in the longer direction of fine pattern printed circuit board to be plated into the electroless copper plating solution by the use of a porous alkali-resistant resin molded means for dispensing the oxygen-containing gas as small bubbles, and conducting electroless copper plating.

2. A process according to claim 1, wherein the oxygen-containing gas having a bubble diameter of 1.0 mm or less is dispersed in the plating solution in a volume of 1% or more converted into 1 atmospheric pressure based on the volume of plating solution.

3. A process according to claim 1, wherein the oxygen-containing gas having a bubble diameter of 1.0 mm or less is dispersed in the plating solution so as to make the oxygen amount in the dispersed gas 0.1 mole or more per cubic meter of the plating solution.

4. A process according to claim 1, wherein the oxygen-containing gas is supplied to the plating solution at a rate of 0.2 m³/min or more and the volume of bubbles having a bubble diameter of 1.0 mm or less is made 50% or more in the whole bubbles supplied.

5. A process according to claim 4, wherein the oxygen content in the bubbles of oxygen-containing gas having a bubble diameter of 1.0 mm or less is 10% by volume or more.

6. A process according to claim 1, wherein the plating solution further comprises a nonionic surface active agent.

7. A process according to claim 6, wherein the nonionic surface active agent is at least one member selected from the group consisting of polyalkylene oxides and derivatives thereof.

8. A process according to claim 1, wherein the oxygen-containing gas having a bubble diameter of 1.0 mm or less is used together with an oxygen-containing gas having a bubble diameter of 10 mm or more introduced by another separate gas injecting means.

9. A process according to claim 8, wherein the oxygen concentration in the oxygen-containing gas having a bubble diameter of 10 mm or more is lower than that in the oxygen-containing gas having a bubble diameter of 1.0 mm or less.

10. In an apparatus for electroless copper plating using an electroless cooper plating solution comprising a copper salt, a complexing agent for the copper salt, a reducing agent for the copper salt, and a pH adjusting agent, the improvement wherein said apparatus has a means for dispersing an oxygen-containing gas as bubbles having a bubble diameter of about twice or less of the maximum size of a land in the longer direction of a fine pattern printed circuit board to be plated into the electroless copper plating solution; said means for dispersing an oxygen-containing gas comprising a porous alkali-resistant resin molded article.

11. An apparatus according to claim 10, wherein the means for dispersing an oxygen-containing gas is able to disperse an oxygen-containing gas having a bubble diameter of 1.0 mm or less into the plating solution.

12. An apparatus according to claim 11, wherein the means for dispersing an oxygen-containing gas has an ability to make the volume of dispersed oxygen-containing gas 5% or more of the volume of plating solution.

13. An apparatus according to claim 11, wherein the means for dispersing an oxygen-containing gas comprises at least one means comprising said porous alkali-resistant resin molded article for dispersing an oxygen-containing gas having a bubble diameter of 1.0 mm or less and at least one other means for dispersing an oxygen-containing gas having a bubble diameter of 10 mm or more.

14. An apparatus according to claim 11, wherein the means for dispersing an oxygen-containing gas having a bubble diameter of 1.0 mm or less is a porous gas dispersing tube having a pore diameter of 100 $\mu$m or less.

15. An apparatus according to claim 13, wherein the means for dispersing an oxygen-containing gas having a bubble diameter of 10 mm or more is a porous gas dispersing tube having a pore diameter of 1.0 mm or more, and the means for dispersing an oxygen-containing gas having a bubble diameter of 1.0 mm or less is a porous gas dispersing tube having a pore diameter of 100 $\mu$m or less.

16. An apparatus according to claim 14, wherein the porous gas dispersing tube is made from a fluorine-containing resin.

17. An apparatus according to claim 14, wherein the porous gas dispersing tube is subjected to a hydrophilic treatment.

18. An apparatus according to claim 10, wherein the porous article has pores with a pore diameter of from about 100 $\mu$m or less in average to about 10 $\mu$m or less in average.

19. An apparatus according to claim 10, wherein the molded article for dispersing the oxygen-containing gas is a non-moving member.

20. A process according to claim 1, wherein the porous molded means has pores with a pore diameter of from about 100 $\mu$m or less in average to about 10 $\mu$m or less in average.

21. A process according to claim 1, wherein the means for dispersing an oxygen-containing gas is a non-moving member.

* * * * *